(12) United States Patent
Brunelle et al.

(10) Patent No.: US 6,407,566 B1
(45) Date of Patent: Jun. 18, 2002

(54) TEST MODULE FOR MULTI-CHIP MODULE SIMULATION TESTING OF INTEGRATED CIRCUIT PACKAGES

(75) Inventors: Steven J. Brunelle, Boise; Phoung A. Nguyen, Nampa, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/544,701

(22) Filed: Apr. 6, 2000

(51) Int. Cl.$^7$ ................................................ G01R 31/02
(52) U.S. Cl. ........................ 324/758; 324/755; 439/73
(58) Field of Search ................................ 324/754, 755, 324/758, 765, 158.1; 439/73, 68, 74, 331; 361/712, 713, 715, 773, 770

(56) References Cited

U.S. PATENT DOCUMENTS

| | | |
|---|---|---|
| 3,573,617 A | 4/1971 | Randolph et al. |
| 3,670,409 A | 6/1972 | Reimer |
| 4,210,383 A | 7/1980 | Davis |
| 4,716,049 A | 12/1987 | Patraw |
| 4,760,335 A * | 7/1988 | Lindberg .................. 324/758 |
| 4,774,632 A | 9/1988 | Neugebauer |
| 4,893,172 A | 1/1990 | Matsumoto et al. |
| 4,902,606 A | 2/1990 | Patraw |
| 4,924,353 A | 5/1990 | Patraw |
| 4,933,808 A * | 6/1990 | Horton et al. .............. 361/715 |
| 4,975,079 A | 12/1990 | Beaman et al. |
| 5,006,792 A | 4/1991 | Malhi et al. |
| 5,015,191 A | 5/1991 | Grabbe et al. |
| 5,073,117 A | 12/1991 | Malhi et al. |
| 5,086,337 A | 2/1992 | Noro et al. |
| 5,097,101 A | 3/1992 | Trobough |
| 5,139,427 A | 8/1992 | Boyd et al. |
| 5,144,747 A | 9/1992 | Eichelberger |
| 5,149,662 A | 9/1992 | Eichelberger |
| 5,152,695 A | 10/1992 | Grabbe et al. |
| 5,153,814 A | 10/1992 | Wessely |
| 5,173,055 A | 12/1992 | Grabbe |
| 5,175,491 A | 12/1992 | Ewers |
| 5,198,963 A | 3/1993 | Gupta et al. |
| 5,208,529 A | 5/1993 | Tsurishima et al. |
| 5,228,861 A | 7/1993 | Grabbe |
| 5,245,277 A | 9/1993 | Nguyen |
| 5,289,117 A | 2/1994 | Van Loan et al. |
| 5,321,277 A | 6/1994 | Sparks et al. |

(List continued on next page.)

Primary Examiner—Ernest Karlsen
Assistant Examiner—Minh N. Tang
(74) Attorney, Agent, or Firm—TraskBritt (57) ABSTRACT

A test module for simultaneously testing a plurality of IC packages in a simulated multi-chip module environment. The test module includes a module board adapted to receive the IC packages and a plurality of module adapters configured to secure the IC packages to the module board. The module adapters secure the IC packages to the module board and establish electrical contact between the IC package leads and a plurality of contact pads disposed on the module board, with no permanent bonding agent. Reliable electrical connections are established between the IC package leads and the contact pads by a plurality of protruding pins extending from each module adapter, which bias the IC package leads towards the contact pads. A plurality of IC packages assembled into the test module may be subjected to module level testing. During any stage of module level testing, any of the IC packages may be easily removed from the test module without the attendant damage resulting from severing of permanent electrical bonds ordinarily formed between the IC package leads and a conventional multi-chip module substrate. If the IC packages assembled into the test module exhibit specified operational characteristics during module level testing, the IC packages may be removed from the test module without damage and permanently assembled into a multi-chip module.

39 Claims, 5 Drawing Sheets

U.S. PATENT DOCUMENTS

| | | |
|---|---|---|
| 5,329,423 A | 7/1994 | Scholz |
| 5,367,253 A | 11/1994 | Wood et al. |
| 5,376,010 A | 12/1994 | Petersen |
| 5,396,032 A | 3/1995 | Bonham, Jr. et al. |
| 5,400,220 A | 3/1995 | Swamy |
| 5,420,506 A | 5/1995 | Lin |
| 5,476,211 A | 12/1995 | Khandros |
| 5,477,086 A | 12/1995 | Rostoker et al. |
| 5,477,161 A | 12/1995 | Kardos et al. |
| 5,502,397 A | 3/1996 | Buchanan |
| 5,517,515 A | 5/1996 | Spall et al. |
| 5,556,293 A | 9/1996 | Pfaff |
| 5,570,003 A | 10/1996 | Staab |
| 5,578,870 A | 11/1996 | Farnsworth et al. |
| 5,602,422 A | 2/1997 | Schueller et al. |
| 5,611,705 A | 3/1997 | Pfaff |
| 5,628,635 A | 5/1997 | Ikeya |
| 5,629,837 A | 5/1997 | Barabi et al. |
| 5,632,631 A | 5/1997 | Fjelstad et al. |
| 5,637,008 A | 6/1997 | Kozel |
| 5,646,447 A | 7/1997 | Ramsey |
| 5,646,542 A | 7/1997 | Zamborelli et al. |
| 5,648,893 A | 7/1997 | Loo et al. |
| 5,655,926 A | 8/1997 | Moon |
| 5,656,945 A | 8/1997 | Cain |
| 5,669,774 A | 9/1997 | Grabbe |
| 5,686,843 A | 11/1997 | Beilstein, Jr. et al. |
| 5,691,041 A | 11/1997 | Frankeny et al. |
| 5,692,911 A | 12/1997 | Webster et al. |
| 5,702,255 A | 12/1997 | Murphy et al. |
| 5,727,954 A | 3/1998 | Kato et al. |
| 5,730,606 A | 3/1998 | Sinclair |
| 5,746,808 A | 5/1998 | Taylor |
| 5,751,554 A | 5/1998 | Williams et al. |
| 5,786,704 A | 7/1998 | Kim |
| 5,789,271 A | 8/1998 | Akram |
| 5,800,205 A | 9/1998 | Arakawa |
| 5,802,699 A | 9/1998 | Fjelstad et al. |
| 5,810,609 A | 9/1998 | Faraci et al. |
| 5,812,378 A | 9/1998 | Fjelstad |
| 5,823,800 A | 10/1998 | Suehrcke et al. |
| 5,829,988 A | 11/1998 | McMillan et al. |
| 5,857,858 A | 1/1999 | Gorowitz et al. |
| 5,887,344 A | 3/1999 | Sinclair |
| 5,888,837 A | 3/1999 | Fillion et al. |
| 5,905,383 A | 5/1999 | Frisch |
| RE36,217 E | 6/1999 | Petersen |
| 5,923,181 A | 7/1999 | Beilstein, Jr. et al. |
| 5,934,914 A | 8/1999 | Fjelstad et al. |
| 5,947,751 A | 9/1999 | Massingill |
| 5,955,888 A | 9/1999 | Frederickson et al. |
| 5,959,840 A * | 9/1999 | Collins et al. ............... 361/713 |
| 5,973,340 A | 10/1999 | Mohsen |
| 5,973,394 A | 10/1999 | Slocum et al. |
| 5,978,223 A | 11/1999 | Hamilton et al. |
| 5,982,185 A | 11/1999 | Farnworth |
| 5,983,492 A | 11/1999 | Fjelstad |
| 5,984,694 A | 11/1999 | Sinclair |
| 6,002,590 A | 12/1999 | Farnworth et al. |
| 6,007,349 A | 12/1999 | Distefano et al. |
| 6,036,503 A | 3/2000 | Tsuchida |
| 6,037,667 A | 3/2000 | Hembree et al. |
| 6,042,387 A | 3/2000 | Jonaldi |
| 6,043,563 A | 3/2000 | Eldridge et al. |
| 6,062,874 A * | 5/2000 | Matsuda et al. ............... 439/73 |

\* cited by examiner

TEST MODULE FOR MULTI-CHIP MODULE SIMULATION TESTING OF INTEGRATED CIRCUIT PACKAGES

BACKGROUND OF THE INVENTION

1. Field of the Invention

The present invention relates generally to the testing of integrated circuit devices assembled into a multi-chip module. Specifically, the present invention relates to an apparatus, and a method of using the same, for testing integrated circuit packages in a simulated multi-chip module environment.

2. State of the Art

Some types of integrated circuit devices are generally comprised of a semiconductor die attached to a lead frame. The lead frame includes a plurality of conductive leads, or lead fingers. Disposed on an active surface of the semiconductor die is a plurality of bond pads. At least one of the bond pads is electrically coupled to at least one lead finger of the lead frame. Typically, multiple bond pads on the semiconductor die are each electrically coupled—by, for example, a wire bond—to a lead finger. An encapsulant material, such as plastic or ceramic, encases the semiconductor die and a portion of the lead frame to form an integrated circuit (IC) package.

A portion of each of multiple lead fingers of the lead frame extends from the encapsulant material of the IC package of this type to provide external leads for electrically connecting the IC package to other devices. An IC package will generally have multiple external leads extending from at least one surface of the IC package. During fabrication and after encapsulation of the semiconductor die, the external leads are commonly subjected to a trim and form operation in which the external leads may be cut, bent, or otherwise shaped to form a specified configuration. The external leads are usually arranged in a specified pattern, or footprint. One conventional IC package—the small-outline J-lead (SOJ) package—includes external leads that are formed into a hook, or J-shaped, configuration. Many other conventional IC package configurations utilizing lead frame construction are known in the art, such as, for example, the thin small-outline package (TSOP). Methods of fabricating IC packages employing lead frames are well known in the art.

Integrated circuit packages are commonly assembled into multi-chip modules for connection to higher-level packaging, such as a motherboard or a personal computer chassis. Generally, a multi-chip module includes a carrier substrate, such as a printed circuit board, having a plurality of IC packages mounted thereto. Other electrical components, such as resistors, capacitors, inductors, or other suitable devices, may also be mounted on the carrier substrate of the multi-chip module, or even on the IC packages. Electrical communication among the IC packages, between the IC packages and other electrical components on the multi-chip module, and between the IC packages and external devices, is established by conductors on the multi-chip module carrier substrate. The conductors may be conductive traces fabricated on the surface of, or internal to, a printed circuit board. Methods for fabricating printed circuit boards having conductive traces, as well as other types of substrates having conductors thereon, are well known in the art.

The conductors on a multi-chip module substrate may include ends, or contact pads, arranged in a number of contact pad arrays. Each contact pad array includes a plurality of contact pads arranged in a pattern corresponding to the footprint of the IC package intended to be mounted on that contact pad array. Soldering, conductive epoxy, or any other suitable process may be used to permanently attach, and electrically connect, the external leads of an IC package to associated contact pads of an array on a multi-chip module. Methods for permanently attaching and electrically connecting IC packages to substrates are well known in the art. Typically, an assembled multi-chip module includes a plurality of IC packages, wherein each of the IC packages is permanently attached to a contact pad array on a surface of the multi-chip module. By way of example only, a multi-chip module may be a memory module comprised of a carrier substrate having opposing surfaces, with one or both of the opposing surfaces of the carrier substrate including multiple contact pad arrays and a plurality of packages (such as SOJ packages) mounted thereto.

During the fabrication of IC packages, each IC package may be subjected to individual component-level testing, such as burn-in and electrical testing. An IC package that exhibits a desired level of performance during component level testing is generally referred to as a "known good device" or "known good die" while an IC package failing to meet minimum performance characteristics may be referred to as a "known bad device." During the fabrication and assembly of multi-chip modules, an IC package may again be subjected to testing. Testing of a multi-chip module—module level testing—may include burn-in, electrical characterization and performance evaluation, as well as other desired electrical testing.

If a multi-chip module fails to exhibit minimum operating characteristics during module level testing, an IC package causing the failure—which may have previously been identified as a "known good device" during component level testing—must be removed from the multi-chip module and replaced. Also, it may be desirable to introduce a "known bad" IC package into a multi-chip module for module level testing in order to observe the electrical characteristics of the multi-chip module with the "known bad" IC package, or to observe the electrical characteristics of the "known bad" IC package at the module level. After module level testing is complete, the "known bad" IC package must be removed from the multi-chip module and replaced. Thus, although individual IC packages are typically tested at the component level, it is desirable to subject IC packages to further testing at the module level, as a "known good device" may fail at the module level and, further, because incorporation of a "known bad device" in a module may be useful in module level testing.

To test IC packages in a multi-chip module environment, module level testing is generally performed after the IC packages are assembled into—and permanently attached to—a multi-chip module carrier substrate. Thus, if an IC package must be removed from a multi-chip module after module level testing, the permanent electrical bonds between the external leads of the IC package and the contact pads on the multi-chip module carrier substrate must be severed. Severing the permanent electrical bonds—which typically comprise solder or conductive epoxy—may cause both heat-induced and mechanical damage to the multi-chip module substrate and conductors, to the external leads and electrical bonds of the IC packages remaining on the multi-chip module, and to other electrical components mounted on the multi-chip module.

To prevent heat-induced and mechanical damage resulting from severing of the permanent electrical bonds between the external leads of an IC package and a plurality of contact pads on a multi-chip module, IC packages may be non-permanently attached to a multi-chip module during module level testing. Use of non-permanent connections between the external leads of an IC package and a contact pad array allows for easy removal of the IC package after module level testing without any resulting damage from the severing of permanent electrical bonds. Devices for non-permanently attaching an IC package to a substrate, such as test sockets, clamps, and fixtures, are well known in the art.

Use of non-permanent electrical connections between the external leads of an IC package and a contact pad array on the multi-chip module can, however, itself cause problems during module level testing. Non-planarities in the multi-chip module carrier substrate, in the conductors forming a contact pad array, or in the IC package itself, may—in the absence of a permanent bonding agent—result in poor electrical contact between an external lead of the IC package and a corresponding contact pad on the multi-chip module. Similarly, for some types of IC packages such as the SOJ package, deflection of the external leads as they come into contact with the contact pads on the multi-chip module may—again, in the absence of a permanent bonding agent such as solder or conductive epoxy—result in poor electrical contact. Poor electrical contact resulting from these non-planarities or lead deflections may produce unreliable test data during module level testing, or prohibit the acquisition of any meaningful test data. Non-penmanently attaching IC packages to a multi-chip module during module level testing may cause other problems as well. For example, use of clamps and other fixtures to temporarily attach IC packages to a multi-chip module substrate can potentially cause mechanical damage to other electrical components mounted on the substrate.

Therefore, a need exists in the art for an apparatus and method for testing IC packages at the module level that allow any IC package causing a failure at the module level, or a "known bad" IC package intentionally introduced to a multi-chip module for purposes of module level testing, to be easily discarded and replaced without the attendant damage caused by severing of permanent electrical bonds. Such an apparatus and method must also provide for non-permanent, robust electrical connections with the external leads of each IC package so that reliable test data can be obtained.

SUMMARY OF THE INVENTION

The present invention comprises a test module for simultaneously testing a plurality of IC packages in a simulated multi-chip module environment. The test module includes a module board configured to receive the IC packages and a plurality of module adapters configured to secure the IC packages to the module board. The module board includes a plurality of conductors and contact pads configured to establish electrical communication with the external leads of the IC packages. The module adapters secure the IC packages to the module board and establish effective, reliable electrical contact between the IC package leads and the contact pads with no permanent bonding agent such as solder or conductive epoxy. Robust electrical connections are established between the IC package leads and the contact pads by a plurality of protruding pins extending from each module adapter, which bias the IC package leads towards the contact pads.

A plurality of IC packages assembled into the test module according to the present invention may be subjected to module level testing. If an IC package causes a failure at the module level, or if a "known bad" IC package is assembled into the test module for module level testing, that particular IC package can be easily removed from the test module without the attendant damage resulting from the severing of permanent electrical bonds between external leads of the IC package and the multi-chip module substrate. If the IC packages assembled into the test module exhibit specified, desirable operational characteristics during module level testing, the IC packages can be removed from the test module without damage and permanently connected to the carrier substrate of a multi-chip module intended for use in, for example, a personal computer.

BRIEF DESCRIPTION OF THE SEVERAL VIEWS OF THE DRAWINGS

While the specification concludes with claims particularly pointing out and distinctly claiming that which is regarded as the present invention, the features and advantages of this invention can be more readily ascertained from the following detailed description of the invention when read in conjunction with the accompanying drawings, in which:

DETAILED DESCRIPTION OF THE INVENTION

FIGS. 1 through 8 make reference to many identical elements, and these identical elements retain the same numerical designation in all figures.

Figure 1:
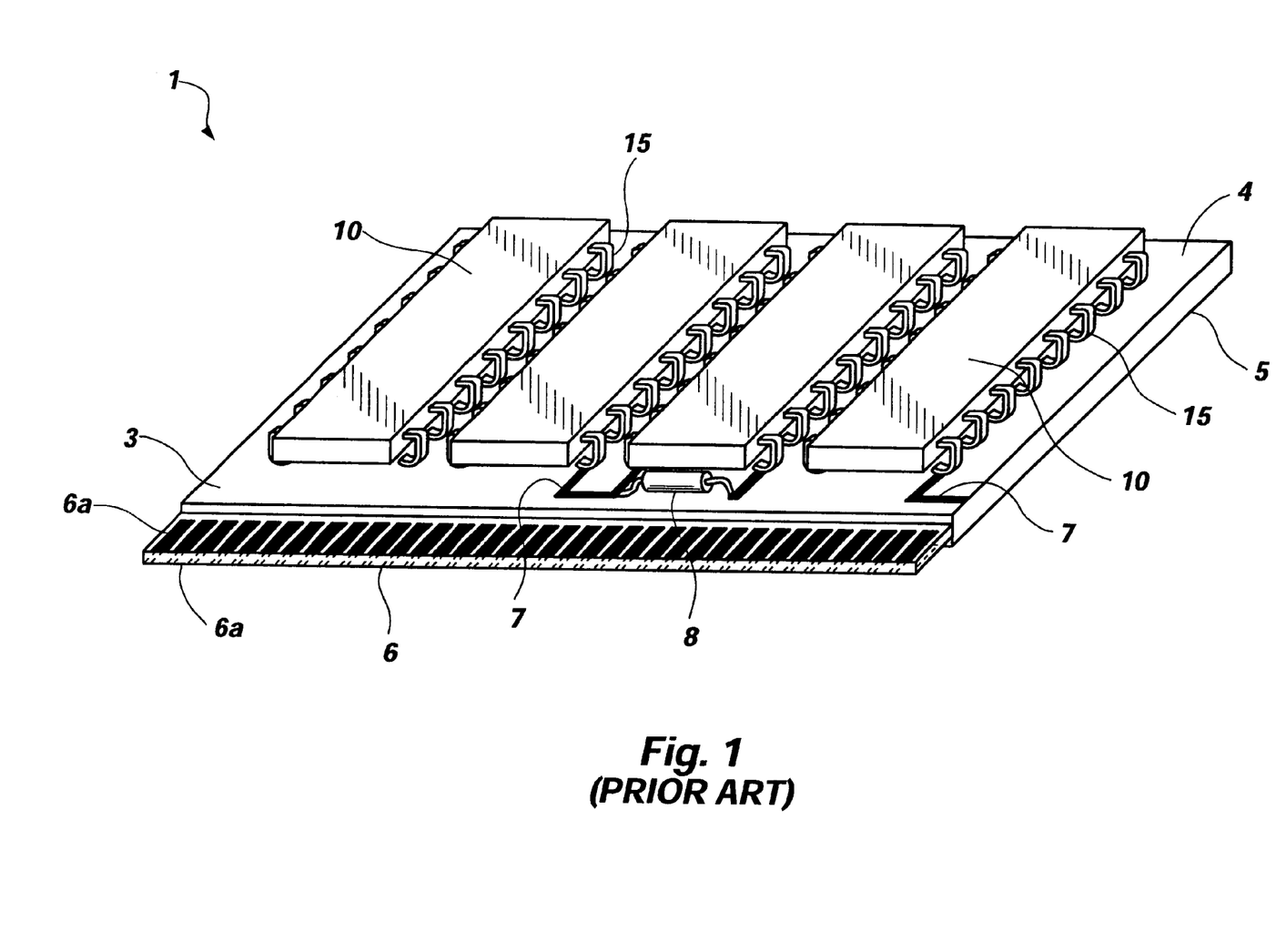
FIG. 1 is a perspective view of a conventional multi-chip module.

An exemplary embodiment of a conventional multi-chip module is shown in FIG. 1. The conventional multi-chip module 1 includes a substrate 3 having opposing surfaces 4, 5. The substrate 3 may be a printed circuit board having a plurality of surface conductors 7 on its surfaces 4, 5. Internal conductors (not shown) may also be disposed within the substrate 3. Methods of fabricating substrates having both surface conductors and internal conductors, such as printed circuit boards, are well known in the art.

The multi-chip module 1 further includes a plurality of IC packages 10 that is mounted to the substrate 3. Each IC package 10 includes a plurality of external leads 15 extending from one or more surfaces of the IC package 10. The external leads 15 of each IC package 10 are permanently electrically connected to a contact pad array (not shown) formed by ends or contact pads of the surface conductors 7. Permanent electrical connections between the IC package leads 15 and the contact pads on the multi-chip module substrate 3 may be formed using a soldering process, a conductive epoxy process, or any other suitable process as known in the art. The IC packages 10 may be any suitable integrated circuit devices as are known in the art such as, by way of example only, the exemplary SOJ packages depicted in FIG. 1. Methods of fabricating IC packages with lead frame construction, such as the SOJ package, are well known in the art.

The multi-chip module 1 may also include one or more passive electrical components 8 mounted thereto and in electrical communication with one or more of the IC packages 10. Resistors, capacitors, inductors, and other suitable passive electrical devices may also be mounted to conventional multi-chip modules. The multi-chip module 1 may further include a connector 6 for electrically coupling the multi-chip module 1 to an external device (not shown) such as a motherboard or personal computer chassis, connector 6 also being used to interface with test equipment. The connector 6 may be any suitable connector, many of which are known to one of ordinary skill in the art, but is usually an edge connector comprising a plurality of laterally separated contacts 6a, as shown in FIG. 1. Electrical communication among the IC packages 10, between the IC packages 10 and other electrical components 8, and between the IC packages 10 and the connector 6, is established by both the surface conductors 7 and internal conductors (if employed) of substrate 3.

The multi-chip module 1 may be subjected to module level testing. If the multi-chip module 1 fails to exhibit specified electrical characteristics during module level testing, an IC package or packages 10 causing the failure must be removed from the multi-chip module 1 and replaced. Removal of an IC package 10 from the multi-chip module 1 requires severing of the permanent electrical connections between the external leads 15 of the IC package 10 and the contact pads on a surface 4, 5 of the substrate 3. The process of severing the permanent electrical bonds may cause heat-induced and mechanical damage to the remaining IC packages 10, to the substrate 3 and surface conductors 7, and to any electrical components 8 mounted to the multi-chip module 1.

Figure 2:
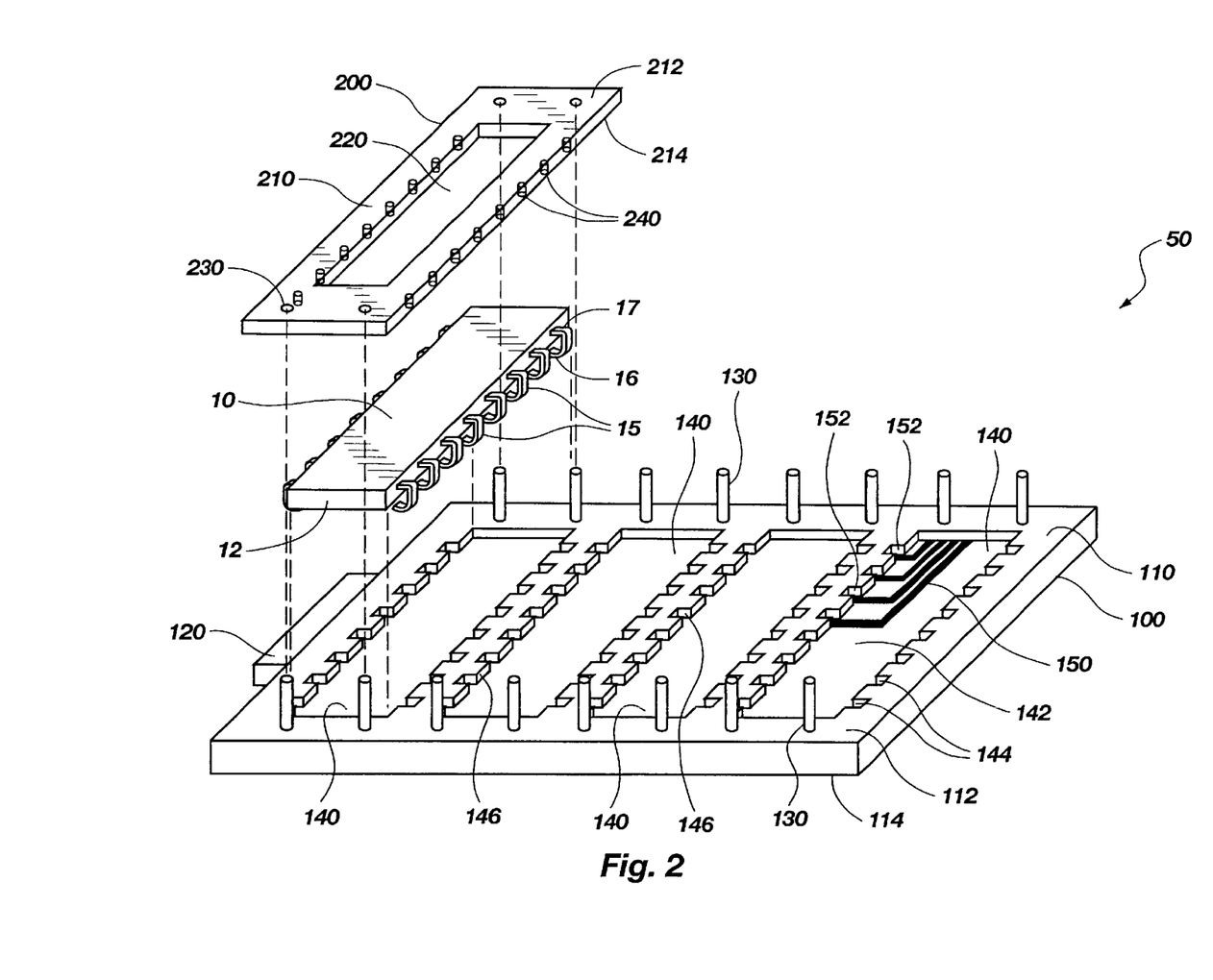
FIG. 2 is an exploded, perspective view of a test module according to the present invention.

FIG. 2 depicts a test module 50 according to the present invention. As an alternative to performing module level testing of IC packages permanently mounted on a multi-chip module substrate, the test module 50 provides a method of effectively evaluating IC packages in a non-damaging fashion at the module level in a simulated multi-chip module environment. Using the test module 50 of the present invention, all of the IC packages for a multi-chip module, such as the multi-chip module 1 depicted in FIG. 1, may be evaluated at the module level prior to being permanently mounted into the multi-chip module.

Referring to FIG. 2, the test module 50 includes a module board 100 and one or more module adapters 200. The module board 100 is configured to receive a plurality of IC packages 10 on one or both sides thereof The module board 100 and module adapters 200 are cooperatively configured to establish reliable, non-permanent electrical connections between the external leads 15 of each IC package 10 and the other IC packages 10 carried on module board 100, any passive electrical components on module board 100, and external test equipment (not shown). Although the module board 100 is intended as a testing device and does not include permanently attached IC packages, in all other respects, the module board 100 is configured to emulate a multi-chip module, such as the exemplary multi-chip module 1 shown in FIG. 1, during testing. Thus, a plurality of IC packages 10 may be simultaneously tested in a simulated multi-chip module environment using the test module 50 of the present invention. If the IC packages 10 exhibit acceptable operational characteristics during module level testing, the IC packages 10 may be easily removed from the test module 50 and permanently attached to a multi-chip module substrate 3 as shown in FIG. 1.

Figure 3:
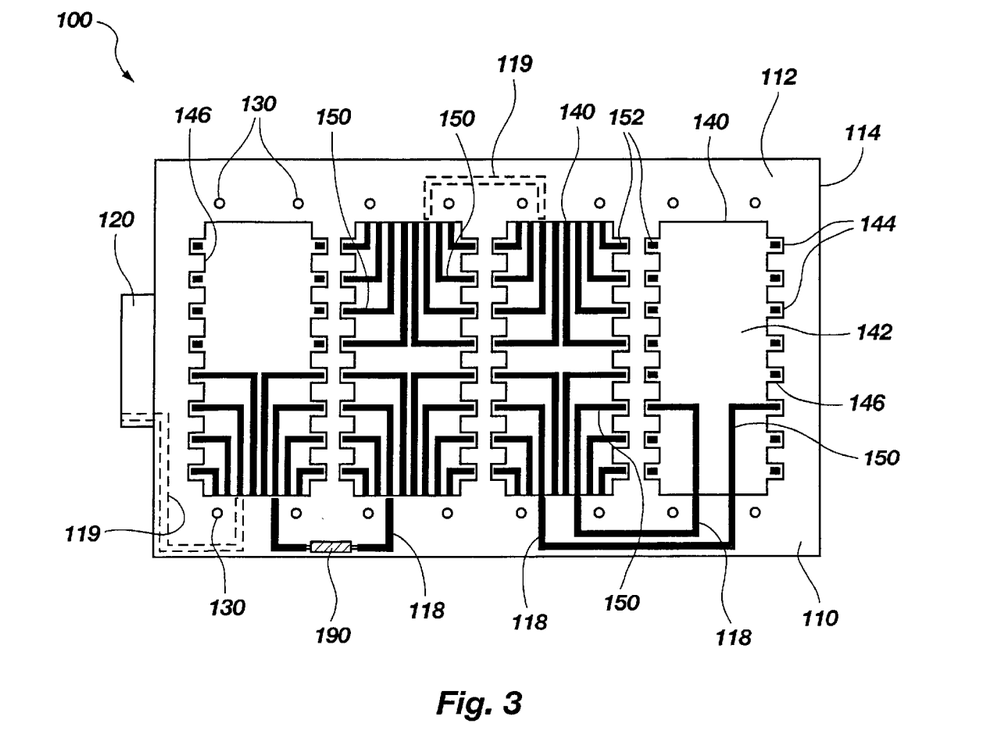
FIG. 3 is a top view of a module board of the test module according to the present invention.
Figure 4:
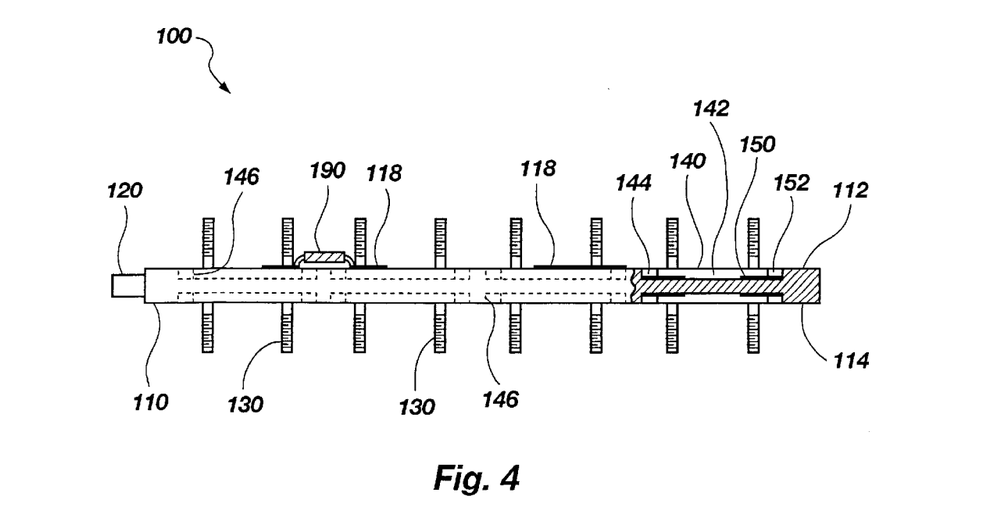
FIG. 4 is a side view of the module board of the test module according to the present invention.

Referring again to FIG. 2 in conjunction with FIGS. 3 and 4, which show the module board 100 in greater detail, the module board 100 is comprised of a base 110 having upper and lower opposing surfaces 112, 114, respectively. The base 110 also includes a plurality of surface conductors 118 and internal conductors 119. One or more electrical components 190, such as resistors, capacitors, inductors, or other suitable electrical devices, may be mounted to the base 110. A plurality of fastener elements 130 is disposed on each of the upper and lower surfaces 112, 114 of the base 110. The module board 100 further includes at least one connector 120 for connecting module board 100 and the components carried thereon to test equipment. The module board 100 may be a printed circuit board fabricated using conventional circuit board fabrication techniques, or any other suitable substrate having conductors as is known in the art. Connector 120 may comprise a plug-type connection, as shown, which may be quite robust and, additionally, facilitate connection of a plurality of test modules 50 to the same tester. Alternatively, module board 100 may be provided with an edge connector as depicted in FIG. 1, or other connector configuration as known in the art.

Disposed on each of the upper and lower surfaces 112, 114 of the base 110 is at least one slot 140 configured to accept an individual IC package 10. Each slot 140 includes a cavity 142 adapted to receive the encapsulated portion 12 of an IC package 10. Each slot 140 further includes a plurality of grooves 144 extending laterally therefrom, each groove 144 being adapted to receive an individual external lead 15 of the IC package 10. The grooves 144 are arranged in a pattern substantially corresponding to the footprint formed by the external leads 15 of the IC package 10. The shape of the slots 140 formed by their respective central cavities 142 and associated grooves 144 as shown in FIG. 3 is exemplary only, and it is to be understood that the shape of a slot 140 may vary depending on the configuration of the particular IC package 10 intended to be received in the slot 140. For example, an IC package exhibiting a quad flat pack (QFP) configuration would employ a rectangular slot having grooves 144 along all four sides. Also, although all of the slots 140 shown in FIG. 3 are of substantially the same shape, those of ordinary skill in the art will appreciate that an individual module board 100 may have slots 140 of varying configurations such that multiple types, shapes and sizes of IC packages 10 may be simultaneously tested. For example, a module board 100 may be configured to receive a processor, logic chip and multiple memory chips.

A plurality of conductors 150 extends into each slot 140 to form an array of contact pads 152. The array of contact pads 152 is arranged in a pattern substantially corresponding to the footprint formed by the external leads 15 extending from an IC package 10, and an individual contact pad 152 is disposed in each of the grooves 144 of each slot 140. The contact pads 152 are each configured to interface with a contact surface 16 of an external lead 15 extending from an IC package 10, and to establish electrical communication therewith. The arrangement of the conductors 150 may vary depending on the type of IC package 10 being tested, the design of the multi-chip module being simulated, and the type of testing being performed. Various patterns of conductors 150 are shown in FIG. 3 and it is to be understood that these patterns are only exemplary.

Figure 5:
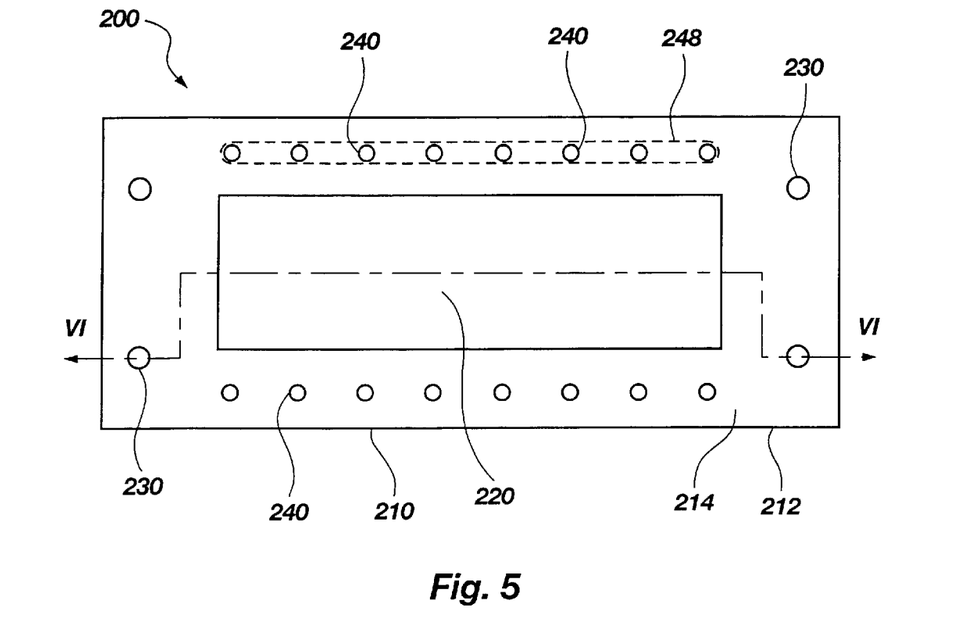
FIG. 5 is a top view of a module adapter of the test module according to the present invention.
Figure 6:
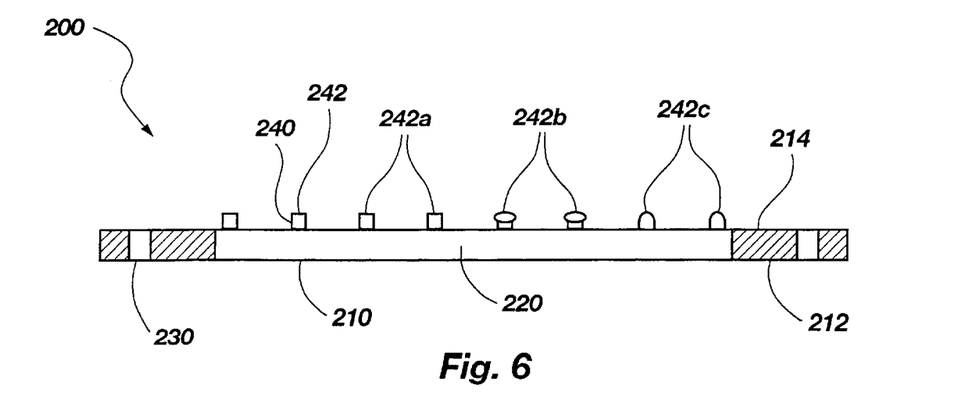
FIG. 6 is a cross-sectional view of the module adapter of the test module according to the present invention as taken along line VI—VI of FIG. 5, with the module adapter depicted in an inverted position.

FIGS. 5 and 6 show a module adapter 200 in greater detail. Referring to FIGS. 5 and 6 in conjunction with FIG. 2, a module adapter 200 includes a plate 210 having exterior and interior opposing surfaces 212, 214, respectively (module adapter 200 being shown in an inverted position in FIG. 6). A plurality of protruding pins 240 is disposed on the interior surface 214 of the module adapter 200. Each protruding pin 240 is configured to contact an outer surface 17 of at least one external lead 15 extending from an IC package 10. The protruding pins 240 are also arranged in a pattern substantially corresponding to the footprint of the IC package external leads 15. Those of ordinary skill in the art will appreciate that a protruding pin 240 may interface with more than one external lead of an IC package 10 and, further, that a single protruding pin, such as the nonconductive rail 248 (shown in dashed lines), may replace a plurality of individual protruding pins 240.

A portion of each protruding pin 240 forms a contact surface 242 adapted to impinge upon the outer surface 17 of an external lead 15. The contact surfaces 242 may be of any suitable configuration including, but not limited to, a generally flat surface 242a, an enlarged surface 242b, or a generally spherical surface 242c. In a further embodiment, the protruding pins 240 may be spring-biased pins. The plate 210 may be manufactured from any suitable material, such as a non-conductive, anti-static plastic material. Similarly, the protruding pins 240 may be fabricated from any suitable material, including both ferrous and non-ferrous metals as well as plastics and resilient elastomers.

Figure 7:
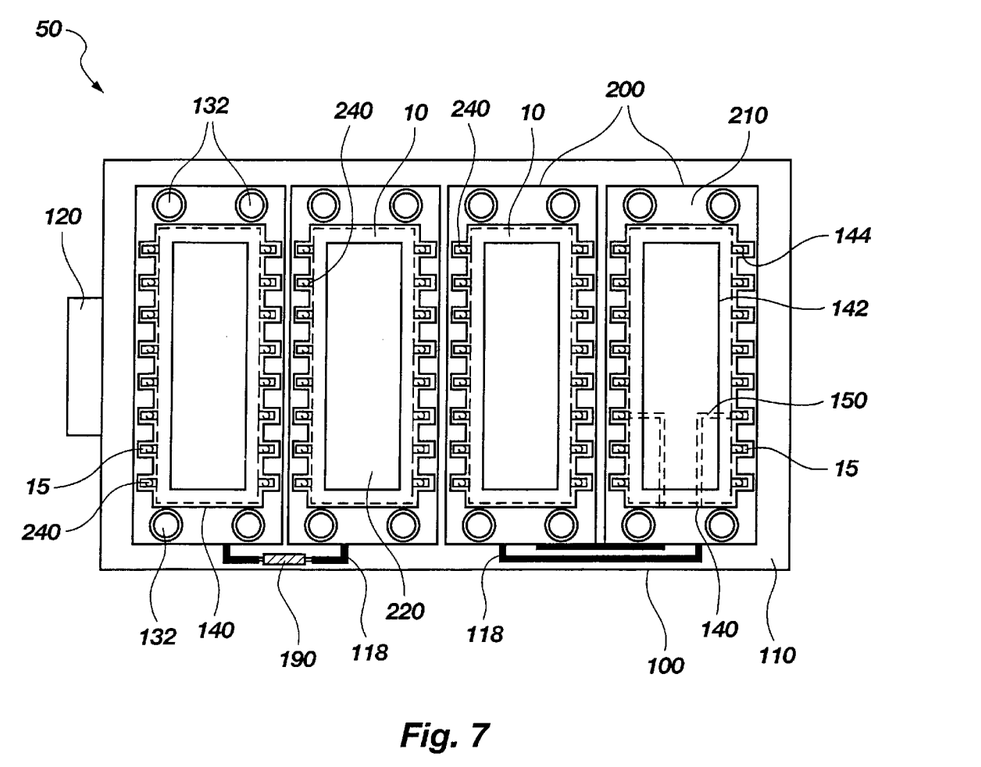
FIG. 7 is a top view of the test module according to the present invention including a plurality of IC packages assembled therein.
Figure 8:
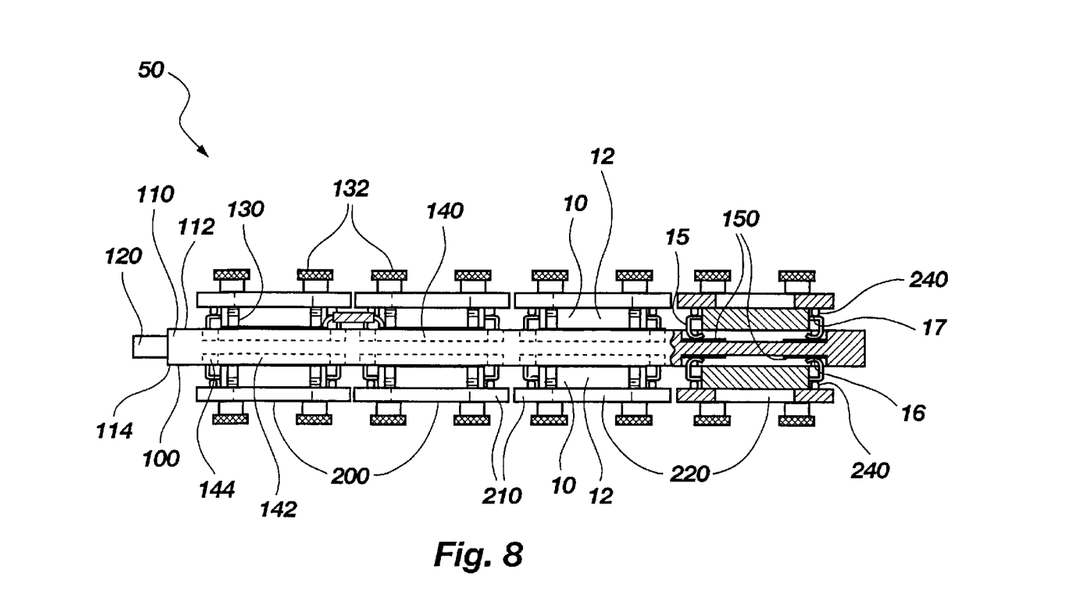
FIG. 8 is a side view of the test module according to the present invention including a plurality of IC packages assembled therein.

FIGS. 7 and 8 show a plurality of IC packages 10 assembled into the test module 50 for module level testing. Although four IC packages 10 are shown mounted to each surface 112, 114 of the module board 100, it is to be understood that any suitable number of IC packages 10 may be assembled into the test module 50 and, further, that IC packages 10 may be assembled onto only one surface 112, 114 of the module board 100.

The IC packages 10 are disposed in the slots 140, such that the encapsulated portion 12 of each IC package 10 is received in the cavity 142 of a slot 140, while the external leads 15 rest in the grooves 144. The contact surface 16 of each IC package external lead 15 resting within a groove 144 is aligned with a contact pad 152 disposed in that groove 144. Alignment between a contact surface 16 and a contact pad 152 is at least partially assisted by the walls 146 of the cavity 142 and grooves 144. A module adapter 200 secures each IC package 10 to the module board 100. An individual module adapter 200 is placed over a mating individual IC package 10 such that the interior surface 214 of module adapter 200 lies adjacent the IC package 10 and the protruding pins 240 face towards the IC package 10. The interior surface 214 of the module adapter 200 may abut the IC package 10, as shown in FIGS. 7 and 8. The contact surface 242 of each protruding pin 240 on the module adapter 200 impinges upon an outer surface 17 of at least one external lead 15 of the mating IC package 10 to bias the at least one external lead 15 toward an associated contact pad 152.

The module adapters 200, and the IC package 10 mating with each module adapter 200, may be secured to the module board 100 by the fastener elements 130 disposed on the base 110 of the module board 100. The fastener elements 130 may be of any suitable configuration adapted to secure the module adapters 200 to the module board 100. For example, as shown in FIGS. 3, 4, 7, and 8, the fastener elements 130 may simply be threaded studs extending from the surfaces 112, 114 of the base 110. Apertures 230 extending through the plate 210 of each module adapter 200, as seen in FIGS. 2, 5, and 6, enable a plurality of fastener elements 130 to couple with each module adapter 200. Thumb nuts 132 may secure the module adapters 200 to the fastener elements 130. Those of ordinary skill in the art will appreciate that the fastener elements 130 may be of any other suitable configuration. For example, a fastener element 130 may be a clamp, a spring clip, a cleat, or a shaft having a retaining key configured to mate with a corresponding keyhole in a module adapter 200. Another alternative is the use of post-type fastener elements 130 which extend through apertures 230 of a module adapter 200, the apertures 230 being lined with resiliently biased collars. Alternative fasteners, such as clamps or spring clips, may be more suitable for use with automated test and handling equipment. It will be further appreciated by those of ordinary skill in the art that the fastener elements 130 may be disposed on the module adapters 200, or on both the module board 100 and module adapters 200. It will also be appreciated that module adapters 200 may be configured to extend over more than one slot 140, or even all of the slots 140 on one side of base 110 of module board 100, as desired, to facilitate assembly of IC packages 10 with module board 100.

As shown in FIGS. 2, 5, and 6, a module adapter 200 may include a window 220. The window 220 may facilitate the attachment of an IC package 10 to the module board 100. The window 220 may assist in alignment of the module adapter 200 relative to the IC package 10 by allowing the IC package 10 to be viewed through the module adapter 200. In another embodiment, the window 220 may be sized and shaped such that the window 220 is adapted to removably receive and grasp an IC package 10. The window 220 may be configured to form a snug, interference fit between the window 220 and an IC package 10, such that the IC package 10 removably "snaps" into the window 220. If desired, the inner periphery of a window 220 may be lined with a resilient elastomer bead to facilitate retention of an IC package 10 therein. Configuring the module adapters 200 to grasp the IC packages 10 facilitates placement and alignment of the IC packages 10 in the slots 140 in the base 110 of the module board 100. Those of ordinary skill in the art will appreciate that a module adapter 200 may include other suitable retaining structures adapted to removably grasp an IC package 10, such as, by way of example only, a plurality of resilient tabs.

When secured to the module board 100, the external leads 15 of each IC package 10 are each biased toward a contact pad 152 as a result of compressive forces exerted on the outer surface 17 of each external lead 15 by a protruding pin 240. The compressive force exerted on each external lead 15 creates positive physical and electrical contact between the contact surface 16 of each external lead 15 and a contact pad 152, providing a robust electrical connection and compensating for any non-planarities. Also, the walls 146 of the groove 144 surrounding each contact pad 152 prevent lateral deflection or deformation of the external leads 15 as the external leads 15 are subjected to compressive forces.

Mutual electrical communication among the IC packages 10 assembled into the test module 50, and between the IC packages 10 and other electrical components 190 mounted on the module board 100, is established by the conductors 150, contact pads 152, surface conductors 118, and internal conductors 119. As shown in FIGS. 2, 3, and 4, the module board 100 further includes a connector 120 attached to the base 110. The connector 120, which is in electrical communication with the IC packages 10 via the conductors 150, contact pads 152, surface conductors 118, and internal conductors 119, is configured to electrically connect the test module 50 and attached IC packages 10 to an external test device, such as a multi-module tester. As noted above, the connector 120 may be configured as any suitable connector as is known in the art to electrically connect the test module 50 to an external device.

A plurality of IC packages 10 may be tested and characterized using the test module 50 of the present invention according to a method as herein described. The IC packages 10 are first assembled into the test module 50. A plurality of the IC packages 10 is disposed in the slots 140 on one of the surfaces 112, 114 of the base 110 of module board 100. The walls 146 of each groove 144 act as alignment surfaces to assist in aligning the external leads 15 of each IC package 10 with a corresponding contact pad 152 disposed within each groove 144. The walls 146 provide lateral support to external leads 15 and thus further aid in resisting deflection and deformation of the external leads 15 extending from an IC package 10 as the external leads 15 come into contact with the contact pads 152. The IC packages 10 are then secured to the module board 100 with a corresponding number of module adapters 200 (unless, as is noted above, a multi-slot module adapter configuration is employed). Another plurality of IC packages 10 may be disposed on the opposing surface 112, 114 of the base 110 of module board 100 and secured to the module board 100 with module adapters 200. Any suitable fastener elements 130 may be used to attach the module adapters 200 to the module board 100.

The test module 50 being assembled, the protruding pins 240 extending from the module adapters 200 bias the external leads 15 of each IC package 10 into positive physical and electrical contact with the contact pads 152 on the module board 100. Reliable electrical communication is established among the IC packages 10, between the IC packages 10 and other electrical components 190 mounted on the module board 100, and between the IC packages 10 and the connector 120. The connector 120 is electrically connected to external test equipment and the IC packages 10 are subjected to module level testing, the latter as known in the art. During module level testing, the module board 100, accompanying conductors 118, 119, and electrical components 190 emulate the substrate of a conventional multi-chip module, such as the substrate 3 of the exemplary multi-chip module 1 as shown in FIG. 1. Also, the conductors 118, 119 and electrical components 190 may include additional test circuitry not found in a conventional multi chip module substrate configured for installation in a computer.

If, during module level testing, an IC package 10 is identified as failing to exhibit specified electrical or operational characteristics, that IC package 10 is removed from the test module 50 and replaced. Removal and replacement of the failed IC package 10—as well as a "known bad" IC package introduced for module level testing—requires only the detachment of the module adapter 200 mating with the failed IC package 10, as no permanent bonding agent is necessary to secure the IC packages 10 into the test module 50. A replacement IC package 10 is assembled into the test module 50 and module level testing may be repeated. If a plurality of IC packages exhibits the desired electrical or operational characteristics during module level testing, the IC packages are removed from the test module 50—again, as no permanent bonding agents are used to secure IC packages 10 into the test module 50, there are no permanent electrical bonds to sever—and may be permanently assembled with a suitable carrier substrate such as substrate 3 depicted in FIG. 1 into a multi-chip module for shipment to a customer.

Those of ordinary skill in the art will appreciate the advantages of the test module 50 according to the present invention. A plurality of IC packages 10 may be simultaneously tested and characterized in a simulated multi-chip module environment. Because the test module 50 emulates a multi-chip module without the necessity of permanently attaching the external leads 15 of an IC package 10 to a multi-chip module substrate, heat-induced and mechanical damage to the IC packages 10 and the external leads 15 extending therefrom, to the multi-chip module substrate, and to any electrical components mounted on the multi-chip module substrate, is prevented. IC packages 10 may be easily, and without damage, inserted and removed from the test module 50 at any stage of module level testing.

The foregoing detailed description and accompanying drawings are only illustrative and not restrictive. They have been provided primarily for a clear and comprehensive understanding of the present invention and no unnecessary limitations are to be implied or understood therefrom. Numerous additions, deletions, and modifications to the illustrated embodiments, as well as alternative arrangements, may be devised by those skilled in the art without departing from the spirt of the present invention and the scope of the appended claims.

What is claimed is:

1. A test module for testing integrated circuit packages having leads extending therefrom, comprising:
    a module board including a first surface and an opposing second surface;
    at least one slot disposed on one of said first surface and said second surface of said module board configured to receive at least a portion of an integrated circuit package having leads extending therefrom;
    a plurality of contact pads disposed in said at least one slot;
    at least one module adapter configured to retain said integrated circuit package in said at least one slot with at least one of said leads superimposed on a contact pad of said plurality of contact pads;
    at least one fastener element configured to attach said at least one module adapter to said module board in alignment with said at least one slot; and
    a plurality of protruding pins disposed on said at least one module adapter, at least one protruding pin of said plurality of protruding pins located and configured to contact and bias at least one of said leads extending from said integrated circuit package against a contact pad of said plurality of contact pads.

2. The test module of claim 1, further comprising at least one surface associated with said at least one slot configured to at least partially restrict lateral deflection of one of said leads extending from said integrated circuit package.

3. The test module of claim 1, further comprising at least one surface conductor disposed on said module board and at least one internal conductor disposed in said module board.

4. The test module of claim 3, further comprising a connector disposed on said module board in electrical communication with at least one of said at least one surface conductor and said at least one internal conductor.

5. The test module of claim 3, wherein said module board comprises a printed circuit board.

6. The test module of claim 3, further comprising at least one electrical component disposed on said module board in electrical communication with at least one of said at least one surface conductor and said at least one internal conductor.

7. The test module of claim 1, further comprising at least one retaining structure carried by said at least one module adapter and configured to removably grasp said integrated circuit package.

8. The test module of claim 1, further comprising a plurality of conductors disposed in said at least one slot, portions of said plurality of conductors forming said plurality of contact pads.

9. An apparatus for simulating a multi-chip module including a substrate and a plurality of integrated circuit packages electrically connected to said substrate, said apparatus comprising:
 a base configured to emulate a conductor pattern of a substrate of said multi-chip module;
 at least one slot disposed on said base and configured to receive at least a portion of an integrated circuit package of said plurality of integrated circuit packages;
 at least one plate configured to secure said integrated circuit package in said at least one slot;
 at least one protruding pin disposed on said at least one plate configured to contact and bias and matingly engage at least one lead of a plurality of leads extending from said integrated circuit package into electrical contact with one substantially planar contact pad of a plurality of substantially planar contact pads disposed in said at least one slot; and
 at least one fastener element adapted to attach said at least one plate to said base.

10. The apparatus of claim 9, further comprising at least one surface associated with said at least one slot configured to at least partially restrict lateral deflection of said at least one lead of said plurality of leads extending from said integrated circuit package.

11. The apparatus of claim 9, further comprising a plurality of conductors disposed on said base, at least one conductor of said plurality of conductors electrically coupled to said one contact pad of said plurality of contact pads.

12. The apparatus of claim 11, further comprising at least one electrical component disposed on said base electrically coupled to at least one conductor of said plurality of conductors.

13. The apparatus of claim 11, further comprising at least one connector disposed on said base and electrically coupled to at least one conductor of said plurality of conductors, said at least one connector configured for connecting said at least one conductor to external circuitry.

14. The apparatus of claim 9, further comprising a window disposed in said at least one plate configured to receive at least another portion of said integrated circuit package.

15. A test module for testing integrated circuit packages, each of said integrated circuit packages including an encapsulated portion and a plurality of external leads extending therefrom, said test module comprising:
 a module board having first and second opposing surfaces;
 at least one slot disposed on said first surface of said module board and configured to receive one of said integrated circuit packages, said at least one slot including a cavity configured to receive at least a part of said encapsulated portion of said one integrated circuit package and further including a plurality of grooves extending laterally from said cavity, each groove of said plurality of grooves configured to receive one of said plurality of external leads extending from said one integrated circuit package;
 at least one module adapter configured to retain said one integrated circuit package in said at least one slot on said first surface of said module board with said plurality of external leads of said one integrated circuit package received in said plurality of grooves;
 at least one fastener element located and configured to secure said at least one module adapter to said module board in alignment with said at least one slot; and
 a plurality of protruding pins disposed on said at least one module adapter, each protruding pin of said plurality of protruding pins being located and configured to contact and bias at least one of said plurality of external leads extending from said one integrated circuit package into electrical contact with an associated contact pad disposed in said each groove of said plurality of grooves on said first surface of said module board.

16. The test module of claim 15, further comprising:
 at least a second slot disposed on said second surface of said module board configured to receive another one of said integrated circuit packages, said at least a second slot including a cavity configured to receive at least part of said encapsulated portion of said another one integrated circuit package and further including a plurality of grooves extending laterally from said at least a second slot cavity, each groove of said plurality of grooves of said at least a second slot configured to receive one of said plurality of external leads extending from said another one integrated circuit package;
 at least one other module adapter configured to retain said another one integrated circuit package in said at least a second slot on said second surface of said module board with said plurality of external leads of said another one integrated circuit package received in said plurality of grooves of said at least a second slot;
 at least another fastener element located and configured to secure said at least one other module adapter to said module board in alignment with said at least a second slot; and
 a plurality of protruding pins disposed on said at least one other module adapter, each protruding pin of said plurality of protruding pins being located and configured to contact and bias at least one of said plurality of external leads extending from said another one integrated circuit package into electrical contact with an associated contact pad disposed in said each groove of said plurality of grooves extending laterally from said at least a second slot cavity.

17. The test module of claim 15, further comprising at least one electrical component attached to one of said first and second surfaces of said module board.

18. The test module of claim 15, further comprising at least one electrical conductor disposed on said module board.

19. The test module of claim 15, further comprising a contact surface on said each protruding pin of said plurality of protruding pins, said contact surface selected from a group consisting of: a generally flat surface, a generally enlarged surface, and a generally spherical surface.

20. The test module of claim 15, further comprising at least one resiliently-biased protruding pin disposed on said at least one module adapter.

21. The test module of claim 15, further comprising at least one non-conductive rail disposed on said at least one module adapter.

22. The test module of claim 15, further comprising at least one wall adjacent said each groove of said plurality of grooves located to at least partially restrict lateral deflection of said one of said plurality of external leads extending from said one integrated circuit package.

23. The test module of claim 15, further comprising a window disposed in said at least one module adapter.

24. The test module of claim 23, wherein said window is configured to receive at least a portion of said one integrated circuit package.

25. The test module of claim 15, wherein said at least one fastener element is selected from a group consisting of a threaded fastener, a clamp, a cleat, a spring clip, a retaining key mating with a keyhole, and a post mating with an aperture lined with a resiliently biased collar.

26. The test module of claim 15, further comprising at least one connector disposed on said module board for electrically connecting said module board to external circuitry.

27. A device for testing a plurality of integrated circuit packages in a simulated multi-chip module environment, comprising:
- a base having a first surface and an opposing second surface;
- a first plurality of slots disposed on said first surface of said base, each slot of said first plurality of slots configured to receive at least a portion of one of said plurality of integrated circuit packages and to at least partially restrict lateral movement of external leads extending from said one integrated circuit package;
- a first plurality of contact pad arrays, each slot of said first plurality of slots having one contact pad array of said first plurality of contact pad arrays disposed therein, each contact pad array of said first plurality of contact pad arrays comprising a plurality of contact pads arranged in a pattern substantially corresponding to a footprint formed by said external leads extending from said one of said plurality of integrated circuit packages and configured to establish electrical contact therewith;
- a first plurality of module adapters, each module adapter of said first plurality of module adapters comprising a plate configured to retain said one of said plurality of integrated circuit packages in said each slot of said first plurality of slots and a plurality of protruding pins extending from said plate, each protruding pin of said plurality of protruding pins being located and adapted to contact and bias at least one external lead of said external leads extending from said one integrated circuit package into electrical contact with one of said contact pads of said first plurality of contact pad arrays; and
- a first plurality of fastener elements, each fastener element of said first plurality of fastener elements configured for attaching one module adapter of said first plurality of module adapters to said base.

28. The device of claim 27, further comprising:
- a second plurality of slots disposed on said second surface of said base, each slot of said second plurality of slots configured to receive at least a portion of one of said plurality of integrated circuit packages and to at least partially restrict movement of external leads extending from said one integrated circuit package;
- a second plurality of contact pad arrays, each slot of said second plurality of slots having one contact pad array of said second plurality of contact pad arrays disposed therein, each contact pad array of said second plurality of contact pad arrays comprising a plurality of contact pads arranged in a pattern substantially corresponding to a footprint formed by said external leads extending from said one of said plurality of integrated circuit packages and configured to establish electrical contact therewith;
- a second plurality of module adapters, each module adapter of said second plurality of module adapters comprising a plate configured to retain said one of said plurality of integrated circuit packages in said each slot of said second plurality of slots and a plurality of protruding pins extending from said plate, each protruding pin of said plurality of protruding pins being located and adapted to contact and bias at least one external lead of said external leads extending from said one integrated circuit package into electrical contact with one of said contact pads of said second plurality of contact pad arrays; and
- a second plurality of fastener elements, each fastener element of said second plurality of fastener elements configured for attaching one module adapter of said second plurality of module adapters to said base.

29. The device of claim 27, further comprising:
- a plurality of conductors disposed on said base, at least one conductor of said plurality of conductors electrically coupled to at least one contact pad array of said first plurality of contact pad arrays; and
- at least one electrical component mounted on said base electrically coupled with another conductor of said plurality of conductors;
- wherein said base, said plurality of conductors, and said at least one electrical component are configured to emulate a multi-chip module substrate.

30. A test module assembly for testing a plurality of integrated circuit packages in a simulated multi-chip module environment, comprising:
- a module board;
- a plurality of slots disposed on said module board, each slot of said plurality of slots receiving at least a portion of one of said plurality of integrated circuit packages therein and including at least one contact pad disposed therein;
- a plurality of module adapters, each module adapter of said plurality of module adapters including a plate securing said one integrated circuit package into a slot of said plurality of slots and further including a plurality of protruding pins extending from said plate, at least one protruding pin of said plurality of protruding pins contacting and biasing at least one external lead of a plurality of external leads extending from said one integrated circuit package into electrical contact with said at least one contact pad; and
- a plurality of fastener elements, at least one fastener of said plurality of fasteners attaching said each module adapter of said plurality of module adapters to said module board with said one integrated circuit package therebetween.

31. The test module assembly of claim 30, further comprising at least one wall associated with said each slot of said plurality of slots located to at least partially restrict lateral deflection of at least one external lead of said plurality of external leads extending from said one integrated circuit package.

32. The test module assembly of claim 30, further comprising at least one connector disposed on said module board configured to electrically couple said at least one contact pad of said each slot to an external device.

33. The test module assembly of claim 30, further comprising at least one conductor electrically coupling said one integrated circuit packages secured in one slot of said plurality of slots to said one integrated circuit packages secured in another slot of said plurality of slots.

34. The test module assembly of claim 30, further comprising at least one electrical component disposed on said module board electrically coupled to at least one of said plurality of integrated circuit packages.

35. A method of testing a plurality of integrated circuit packages in a simulated multi-chip module environment, comprising:

securing said plurality of integrated circuit packages to a board;

directly contacting and biasing each of a plurality of external leads extending from each integrated circuit package of said plurality of integrated circuit packages into electrical contact with one substantially planar contact pad of a plurality of contact pads disposed on said board;

at least partially restricting lateral deflection of at least some of said biased external leads extending from each integrated circuit package;

establishing electrical communication between a test instrument and said each integrated circuit package through conductors carried by said board and extending to said plurality of contact pads; and measuring at least one electrical characteristic of said plurality of integrated circuit packages.

36. The method of claim 35, further comprising:

identifying at least one integrated circuit package of said plurality of integrated circuit packages as causing a module level failure;

removing said at least one integrated circuit package causing said module level failure from said board; and securing at least another integrated circuit package of said plurality of integrated circuit packages to said board in place of said at least one removed integrated circuit package.

37. The method of claim 35, further comprising:

securing at least one known bad integrated circuit package to said board;

directly contacting and biasing each of a plurality of external leads extending from said at least one known bad integrated circuit package into electrical contact with one substantially planar contact pad of said plurality of contact pads disposed on said board;

at least partially restricting lateral deflection of at least some of said biased external leads extending from said at least one known bad integrated circuit package;

establishing electrical communication between a test instrument and said at least one known bad integrated circuit package;

measuring at least one electrical characteristic of said at least one known bad integrated circuit package in combination with said plurality of integrated circuit packages; and removing said at least one known bad integrated circuit package from said board.

38. A method of emulating operation of a multi-chip module, said multi-chip module including a substrate and a plurality of integrated circuit packages attached to said substrate, comprising:

configuring a module board to emulate said substrate of said multi-chip module;

securing said plurality of integrated circuit packages to said module board;

directly contacting and biasing each of a plurality of external leads extending from each integrated circuit package of said plurality of integrated circuit packages into electrical contact with one contact pad of a plurality of contact pads disposed on said module board to establish electrical communication between said plurality of integrated circuit packages and said module board;

at least partially restricting lateral deflection of at least some of said biased external leads extending from said each integrated circuit package;

providing at least one operating electrical signal to said plurality of integrated circuit packages to emulate operation of said multi-chip module; and measuring at least one electrical characteristic of said plurality of integrated circuit packages.

39. The method of claim 38, further comprising:

removing said plurality of integrated circuit packages from said module board; and permanently attaching and electrically connecting said plurality of integrated circuit packages to said substrate of said multi-chip module.

* * * * *

UNITED STATES PATENT AND TRADEMARK OFFICE
CERTIFICATE OF CORRECTION

PATENT NO. : 6,407,566 B1
DATED : June 18, 2002
INVENTOR(S) : Steven J. Brunelle and Phoung A. Nguyen

It is certified that error appears in the above-identified patent and that said Letters Patent is hereby corrected as shown below:

Column 13,
Line 2, first occurrence of "a" change to -- the --

Column 15,
Lines 1 and 2, change "packages" to -- package --

Signed and Sealed this

Twelfth Day of August, 2003

JAMES E. ROGAN
*Director of the United States Patent and Trademark Office*